United States Patent
Han et al.

(10) Patent No.: US 8,081,511 B2
(45) Date of Patent: *Dec. 20, 2011

(54) FLASH MEMORY DEVICE WITH REDUNDANT COLUMNS

(75) Inventors: Jin-Man Han, San Jose, CA (US); Aaron Yip, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/898,070

(22) Filed: Oct. 5, 2010

(65) Prior Publication Data

US 2011/0019474 A1 Jan. 27, 2011

Related U.S. Application Data

(63) Continuation of application No. 12/178,192, filed on Jul. 23, 2008, now Pat. No. 7,821,830.

(51) Int. Cl.
*G11C 11/34* (2006.01)
*G11C 16/06* (2006.01)
*G11C 7/10* (2006.01)
*G11C 8/00* (2006.01)

(52) U.S. Cl. ......... 365/185.09; 365/185.11; 365/189.02; 365/189.05; 365/200; 365/230.03; 365/230.04

(58) Field of Classification Search ............. 365/185.09, 365/185.11, 189.02, 189.05, 200, 230.03, 365/230.04
See application file for complete search history.

(56) References Cited

U.S. PATENT DOCUMENTS

| | | | |
|---|---|---|---|
| 6,373,753 | B1 | 4/2002 | Proebsting |
| 6,754,765 | B1 | 6/2004 | Chang et al. |
| 6,816,420 | B1 | 11/2004 | Liu et al. |
| 2002/0024859 | A1 | 2/2002 | Ooishi |
| 2003/0123320 | A1 | 7/2003 | Wright et al. |
| 2006/0109715 | A1 | 5/2006 | Lee et al. |
| 2007/0019483 | A1 | 1/2007 | Lee et al. |
| 2007/0076497 | A1 | 4/2007 | Chae et al. |
| 2007/0094445 | A1 | 4/2007 | Trika et al. |
| 2007/0106836 | A1 | 5/2007 | Lee et al. |
| 2007/0230255 | A1* | 10/2007 | Fukuda ................... 365/189.05 |
| 2008/0170448 | A1* | 7/2008 | Barth et al. .................. 365/200 |

* cited by examiner

*Primary Examiner* — Ly D Pham

(74) *Attorney, Agent, or Firm* — Knobbe, Martens, Olson & Bear, LLP

(57) ABSTRACT

Apparatus and methods are disclosed, such as those involving a flash memory device. One such apparatus includes a memory block including a plurality of columns. Each of the columns includes a bit line and a plurality of memory cells on the bit line. The plurality of columns include a plurality of groups of regular columns and a plurality of groups of redundant columns. The apparatus also includes a plurality of data latches. Each of the data latches is configured to store data read from a respective one group of regular columns. The apparatus further includes a plurality of redundant data latches. Each of the redundant data latches is configured to store data read from a respective one group of redundant columns. The apparatus also includes a multiplexer configured to selectively output data from the plurality of data latches and the plurality of redundant data latches.

20 Claims, 10 Drawing Sheets

FLASH MEMORY DEVICE WITH REDUNDANT COLUMNS

CROSS-REFERENCE TO RELATED APPLICATIONS

This application is a continuation of U.S. patent application Ser. No. 12/178,192, filed Jul. 23, 2008, the disclosure of which is hereby incorporated by reference in its entirety herein.

BACKGROUND

1. Field of the Invention

Embodiments of the invention relate to memory devices, and more particularly, in one or more embodiments, to flash memory devices.

2. Description of the Related Art

Flash memory devices are non-volatile memory devices which store information on a semiconductor in a way that needs no power to retain the information stored therein. Among flash memory devices, NAND flash memory devices have been widely used as mass-storage devices because of their high storage densities and low costs.

Referring to FIG. 1A, a conventional NAND flash memory device includes a memory block 100. The memory block 100 includes a plurality of memory cells arranged in a matrix form. The illustrated memory block 100 includes first to m-th bit lines BL0-BLm and first to n-th word lines WL0-WLn. In some arrangements, m can be 32,767 or 65,535, and n can be 32 or 64. The bit lines BL0-BLm extend parallel to one another in a column direction. The word lines WL0-WLn extend parallel to one another in a row direction perpendicular to the column direction. The memory block 100 also includes upper and lower bit line select transistors 120a, 120b for selecting the memory block 100 among a plurality of memory blocks by coupling the selected memory block 100 to bit lines extending outside the memory block 100.

Each bit line includes a string of memory cells 110. For example, the second bit line BL1 includes memory cells 110 connected in series. A bit line and memory cells on the bit line is collectively referred to as a "column" in the context of this document.

The memory cells 110 are floating gate transistors. The floating gate transistors of the memory cells 110 of a column are coupled to one another in series from source to drain. The control gates of the floating gate transistors of memory cells 110 in the same row are coupled to the same word line. Each of the memory cells 110 stores a charge (or a lack of charge), wherein the amount of stored charge can be used to represent, for example, one or more states, and wherein the one or more states can represent one or more digits (for example, bits) of data. The memory cell can be either a single-level cell (SLC) or a multi-level cell (MLC). In one arrangement, the amounts of charge stored in the memory cells 110 may be detected by sensing currents flowing through the floating gate transistors of the memory cells 110. In another arrangement, the amounts of charge stored in the memory cells 110 may be detected by sensing the threshold voltage values of the floating gate transistors of the memory cells 110.

FIG. 1B illustrates a cross-section of the floating gate transistors of the memory cells 110 in the second bit line BL1. The floating gate transistors are formed on a substrate 101. Each of the floating gate transistors includes a source region 111 (which is a drain region for a neighboring transistor), a drain region 112 (which is a source region for a neighboring transistor), a doped channel region 114, a first dielectric 116 (for example, a tunnel oxide) 116, a floating gate 118, a second dielectric 120 (for example, a gate oxide, wherein the tunnel and gate oxide can be formed of the same or different material), and a control gate 122. The first dielectric 116 is formed on the channel region 114 to insulate the floating gate 118 from the channel region 114. The second dielectric 120 physically and electrically separates the floating gate 118 from the control gate 122. The control gate 122 is coupled to an appropriate word line, for example, word line WL1. Electrons can be trapped on the floating gate 118 and be used to store data.

Referring to FIG. 2A, a conventional NAND flash memory device employing an interleaved read scheme will be described. The illustrated NAND flash memory device 200 includes a memory block 210, a top data latch 220, a bottom data latch 230, and a multiplexer 240. The NAND flash memory device 200 also includes a top data line 216 and a bottom data line 217. The NAND flash memory device 200 may include other components, for example, sense amplifiers, address decoders, and a controller for the operation thereof.

The memory block 210 includes a plurality of word lines WL0-WLn, a plurality of bit lines BL0-BLm, and a plurality of memory cells 215. The plurality of word lines WL0-WLn extend substantially parallel to one another. The plurality of bit lines BL0-BLm extend substantially parallel to one another and substantially perpendicular to the word lines WL0-WLn. The memory cells 215 are coupled to corresponding word lines WL0-WLn and bit lines BL0-BLm.

In the illustrated arrangement, the memory block 210 includes a regular section 211 and a repair section 212. The repair section 212 is positioned at the left side of the regular section 211 of the memory block 210, but it will be understood that the repair section 212 can be positioned at any other suitable location of the memory block 210 in other arrangements.

In the regular section 211, odd-numbered columns are electrically coupled to the top data latch 220, and even-numbered columns are electrically coupled to the bottom data latch 220. The columns in the regular section 211 may be referred to as regular columns. The repair section 212 includes a plurality of columns that can replace defective columns in the regular section 211. Similar to the columns in the regular section 211, odd-numbered columns are electrically coupled to the top data latch 220, and even-numbered columns are electrically coupled to the bottom data latch 220. The columns in the repair section 212 may be referred to as redundant columns.

The multiplexer 240 receives outputs from the top data latch 220 via the top data line 216 and the bottom data latch 230 via the bottom data line 217, and selectively provides one of the outputs from the data latches 220, 230 in response to a control signal CS. In one arrangement, the multiplexer 240 alternately provides the outputs from the data latches 220, 230 as data in synchronization with a read clock signal. Such a read scheme can be referred to as an interleaved read scheme.

Referring to FIGS. 2A and 2B, a conventional one-way interleaved read scheme will be described below. During a read operation of the NAND flash memory 200, data digits stored on memory cells on a word line are read from the memory cells by sense amplifiers. To output the data digits, a read clock signal RE# and a bit line address signal ADD are provided to the NAND flash memory 200. In the illustrated example, the read clock signal RE# has a period of $T_1$ and a frequency of f1. The bit line address signal ADD has the same period and frequency as the read clock signal RE#. The bit line address signal ADD provides bit line addresses indicative of the locations of memory cells to be read. In the one-way interleaved read scheme, the read clock signal RE# and the bit line address signal ADD have the same frequency.

During a read operation, a word line is selected first. For example, in FIG. 2A, an i-th word line WLi is selected. Then, bit line addresses are provided to the memory block 210, and data digits stored in memory cells on the selected word line are sensed and transferred to either the top data latch 220 or the bottom data latch 230. Referring to FIG. 2B, for example, during each period of the read clock signal RE#, a bit line address ADD is provided to the top and bottom data latches 220, 230. Upon receiving the bit line address ADD, either of the data latches 220, 230 transfers the stored data digits to the top or bottom data line 216 or 217. For example, when a bit line address signal indicates a second bit line BL1, a data digit stored in the top data latch 220 is coupled to the top data line 216. During a subsequent period of the read clock signal RE#, the data digit stored in the top data line 216 is output through the multiplexer 240.

Meanwhile, during the subsequent period of the read clock signal RE#, a data digit in the bottom data latch 230 is output through the multiplexer 240 during the immediately following period of the read clock signal RE#. In this manner, data digits stored on memory cells on odd-numbered and even-numbered bit lines are alternately output through the multiplexer 240 in a sequential manner.

Referring to FIGS. 2A and 2C, a conventional two-way interleaved read scheme will be described below. During a read operation of the NAND flash memory 200, a read clock signal RE# and an address signal are provided to the NAND flash memory 200. The NAND flash memory 200 generates a bottom bit line address signal BADD and a top bit line address signal TADD, and provides them to the memory block 210 of the NAND flash memory 200. In the illustrated example, the read clock signal RE# has a period of $T_2$ and a frequency of f2. The period $T_2$ of the read clock signal RE# of FIG. 2C may be half of the period $T_1$ of FIG. 2B, and the frequency f2 may be twice higher than the frequency f1 of FIG. 2B. As described above, in the two-way interleaved read scheme, the read clock signal RE# has a frequency about twice higher than that of the bit line address signals TADD, BADD. In a four-way interleaved read scheme, the read clock signal RE# has a frequency about four times higher than that of bit line address signals.

Each of the top and bottom bit line address signals TADD, BADD has a period $T_1$ that is twice longer than the period $T_2$ of the read clock signal RE#. Thus, each of the top and bottom bit line address signals TADD, BADD has a frequency f1 that is half of the frequency f2 of the read clock signal RE#. The top and bottom bit line address signals TADD, BADD have a time difference of $T_2$ or $T_1/2$. The top bit line address signal TADD sequentially provides odd-numbered bit line addresses indicative of the locations of memory cells to be read. Similarly, the bottom bit line address signal BADD sequentially provides even-numbered bit line addresses indicative of the locations of memory cells to be read. In other arrangements, the top bit line address signal TADD and the bottom bit line address signal BADD may provide even-numbered and odd-numbered bit line addresses, respectively.

During a read operation, a word line is selected. For example, in FIG. 2A, an i-th word line WLi is selected. Data digits stored in memory cells on the selected word line WLi are sequentially sensed and transferred to either the top data latch 220 or the bottom data latch 230 according to the bit line address signals TADD, BADD.

In the illustrated arrangement, the top and bottom bit line address signals TADD, BADD are provided to the top and bottom data latches 220, 230, respectively. An odd-numbered bit line address in the top bit line address signal TADD is maintained for two periods of the read clock signal RE#. In other words, the top bit line address signal TADD transitions at every other falling edge of the read clock signal RE# in the illustrated arrangement. During this duration, the top data latch 220 receives and stores a data digit from a selected one of the memory cells on the odd-numbered bit line. For example, when an odd-numbered bit line address indicates a second bit line BL1, a data digit stored on a memory cell coupled to the i-th word line WLi and the second bit line BL1 is read and stored in the top data latch 220. During a subsequent period of the read clock signal RE#, the data digit stored in the top data latch 220 is output through the multiplexer 240.

Meanwhile, an even-numbered bit line address in the bottom bit line address signal BADD is maintained for two periods of the read clock signal RE#. The bottom bit line address signal BADD transitions at different every other falling edge of the read clock signal RE#, as shown in FIG. 2C. Thus, transitions of the bottom bit line address signal BADD and the top bit line address signal TADD alternate with each other. Upon receiving the bottom bit line address signal BADD, the bottom data latch 230 receives and stores a data digit from a selected one of the memory cells on the even-numbered bit line. For example, when a bit line address signal indicates a third bit line BL2, a data digit stored on a data latch coupled to the third bit line BL2 is read, and is transferred to the bottom data line 217. During a subsequent period of the read clock signal RE#, the data digit stored in the bottom data line 217 is output through the multiplexer 240. In this manner, data digits stored on memory cells on odd-numbered and even-numbered bit lines are alternately output through the multiplexer 240. This two-way interleaved read scheme of FIG. 2C provides a faster data read rate than the one-way interleaved read scheme of FIG. 2B. Generally, the more the number of interleave groups, the faster the read operation is.

BRIEF DESCRIPTION OF THE DRAWINGS

The embodiments will be better understood from the Detailed Description of Embodiments and from the appended drawings, which are meant to illustrate and not to limit the embodiments, and wherein.

DETAILED DESCRIPTION OF EMBODIMENTS

Figure 1A:
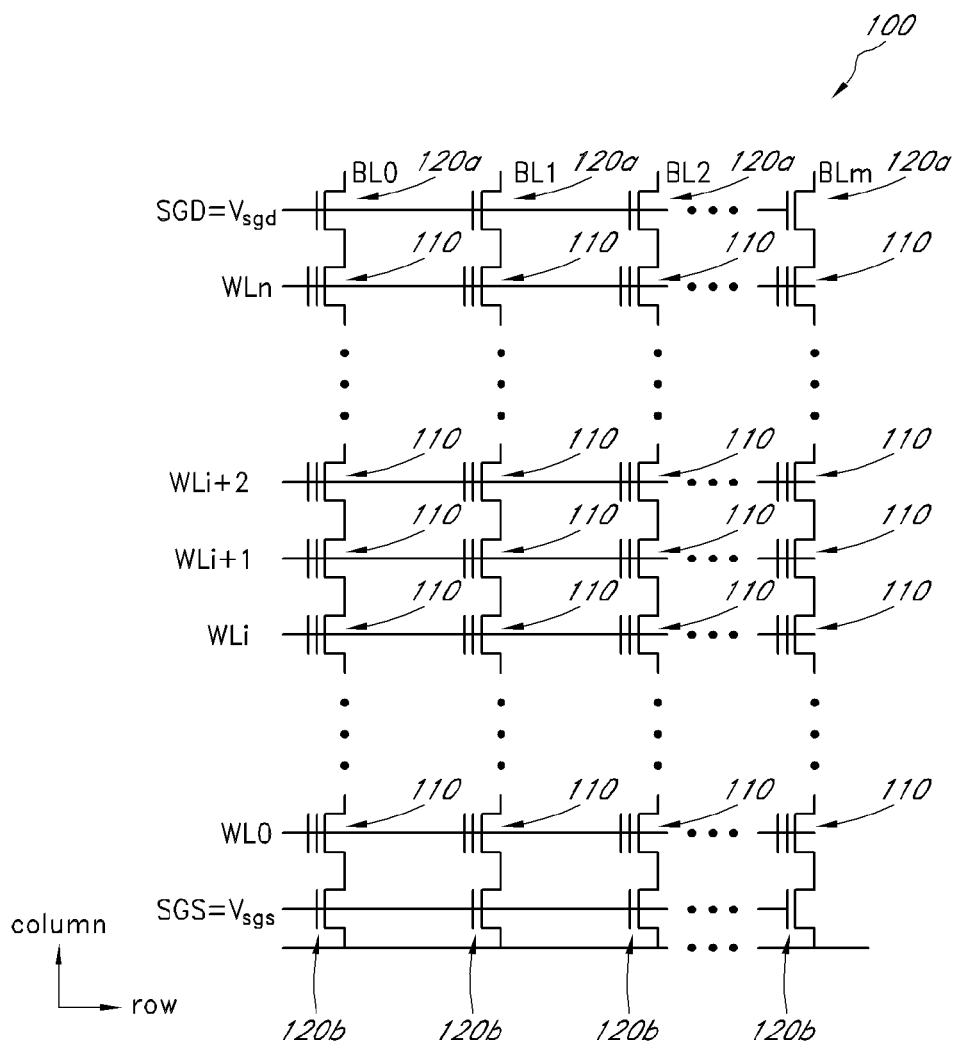
FIG. 1A is a schematic diagram of a memory block of a conventional NAND flash memory device.
Figure 1B:
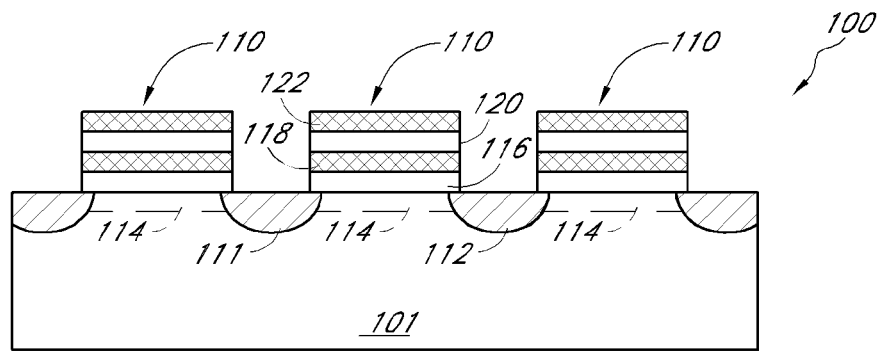
FIG. 1B is a schematic cross-section of the memory block of the conventional NAND flash memory device of FIG. 1A.
Figure 2A:
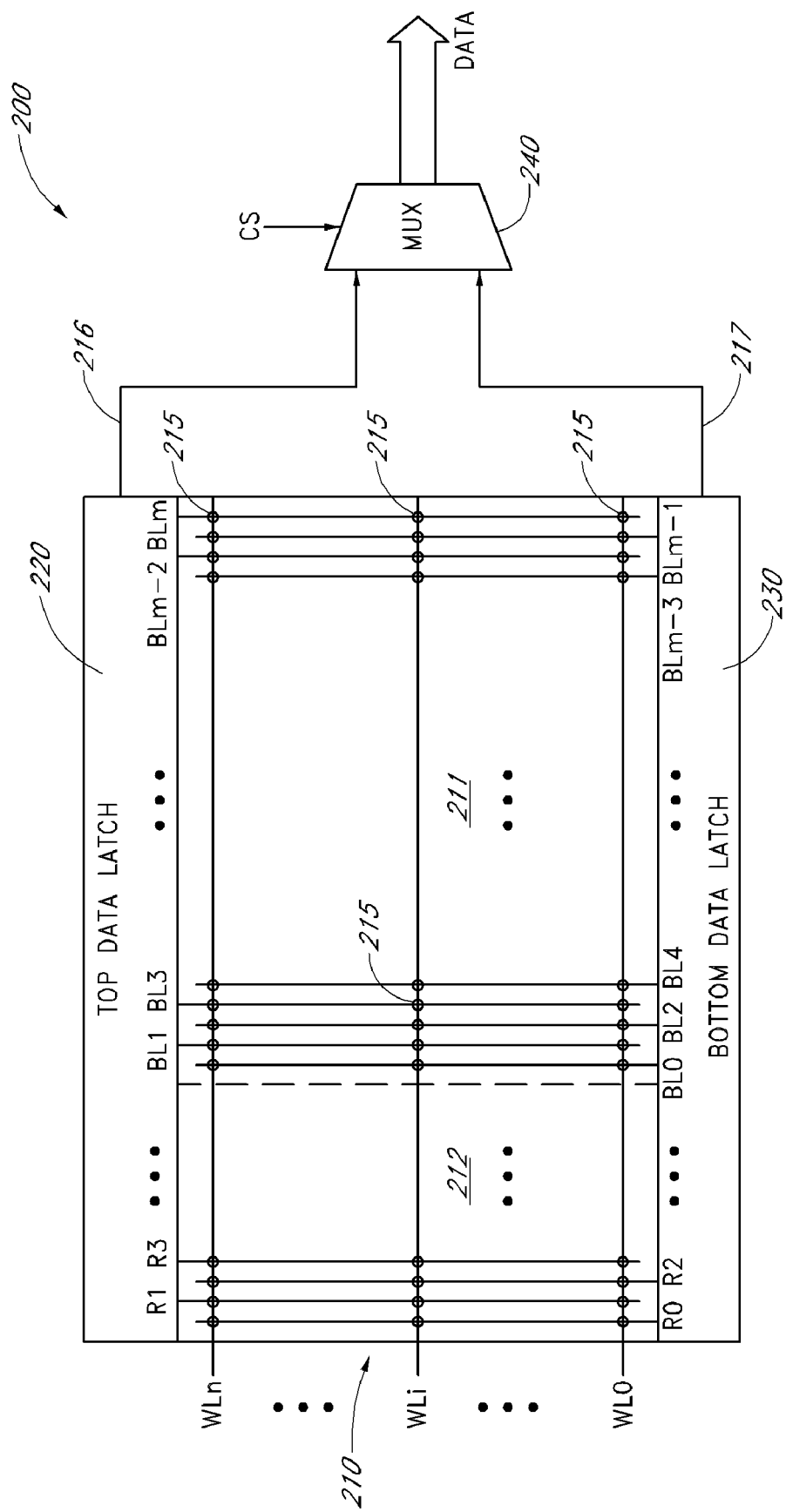
FIG. 2A is a schematic diagram of a conventional NAND flash memory device employing an interleaved read scheme.

In the conventional NAND flash memory device of FIG. 2A, when a column in the regular section 211 has a defective memory cell, the column may be replaced with a redundant column in the repair section 212. This replacement can be performed during the manufacturing process of the NAND flash memory device by conducting the following steps. First, the NAND flash memory device 200 is tested to identify defective memory cells. If so, the address decoder of the NAND flash memory device is configured to map an address to a defective column to a redundant column in the repair section 212. In the context of this document, a column that has one or more defective memory cells can be referred to as a defective column. Similarly, a bit line that has one or more defective memory cells thereon can be referred to as a defective bit line.

In the illustrated NAND flash memory device 200 employing the interleaved read scheme, a defective odd-numbered column in the regular section 211 can only be replaced by one of the odd-numbered redundant columns from the repair section 212. Likewise, a defective even-numbered column in the regular section 211 can only be replaced by one of the even-numbered redundant columns from the repair section 212. The number of redundant columns available for odd-numbered or even-numbered columns is typically half of the number of available redundant columns in a NAND flash memory that has the same number of redundant columns, but does not use an interleaved read scheme.

In certain instances, a number of defective odd-numbered or even-numbered columns may exceed a number of the redundant columns available for replacing the odd-numbered or even-numbered columns while a total number of defective columns is less than a total number of redundant columns. In such instances, the NAND flash memory device cannot be repaired, which can lower production yield and raise costs. Thus, NAND flash memory devices having an interleaved read scheme may have a lower yield than those that do not use such a scheme.

In addition, conventional NAND flash memory devices designed for a specific interleaved read scheme (for example, one-way, two-way, or four-way) may not be converted to have other types of interleaved read schemes. Such a rigid design may prevent manufacturers of NAND flash memory devices of a specific interleaved read scheme from properly responding to market demands for NAND flash memory devices of other types of interleaved read schemes.

In one embodiment, a NAND flash memory device includes a memory block including a plurality of columns. Each of the columns belongs to one of a plurality of interleave groups or one of a plurality of redundancy interleave groups. The number of redundancy interleave groups can be the same as the number of interleave groups. Each of the interleave groups and redundancy interleave groups is coupled to a multiplexer via a respective one of data latches such that data from the groups can be selectively output.

This configuration allows the NAND flash memory device to perform an interleaved read scheme having the same number of ways as the number of the interleave groups when there are sufficient redundant columns for each interleave group. When the number of defective columns in any of the interleave groups exceeds the number of redundant columns in the corresponding redundancy interleave group, the NAND flash memory device can perform an interleaved read scheme having a lower number of ways than the number of the interleave groups. This configuration can provide a higher yield and more flexibility in manufacturing than the fixed conventional interleaved read scheme.

Figure 3:
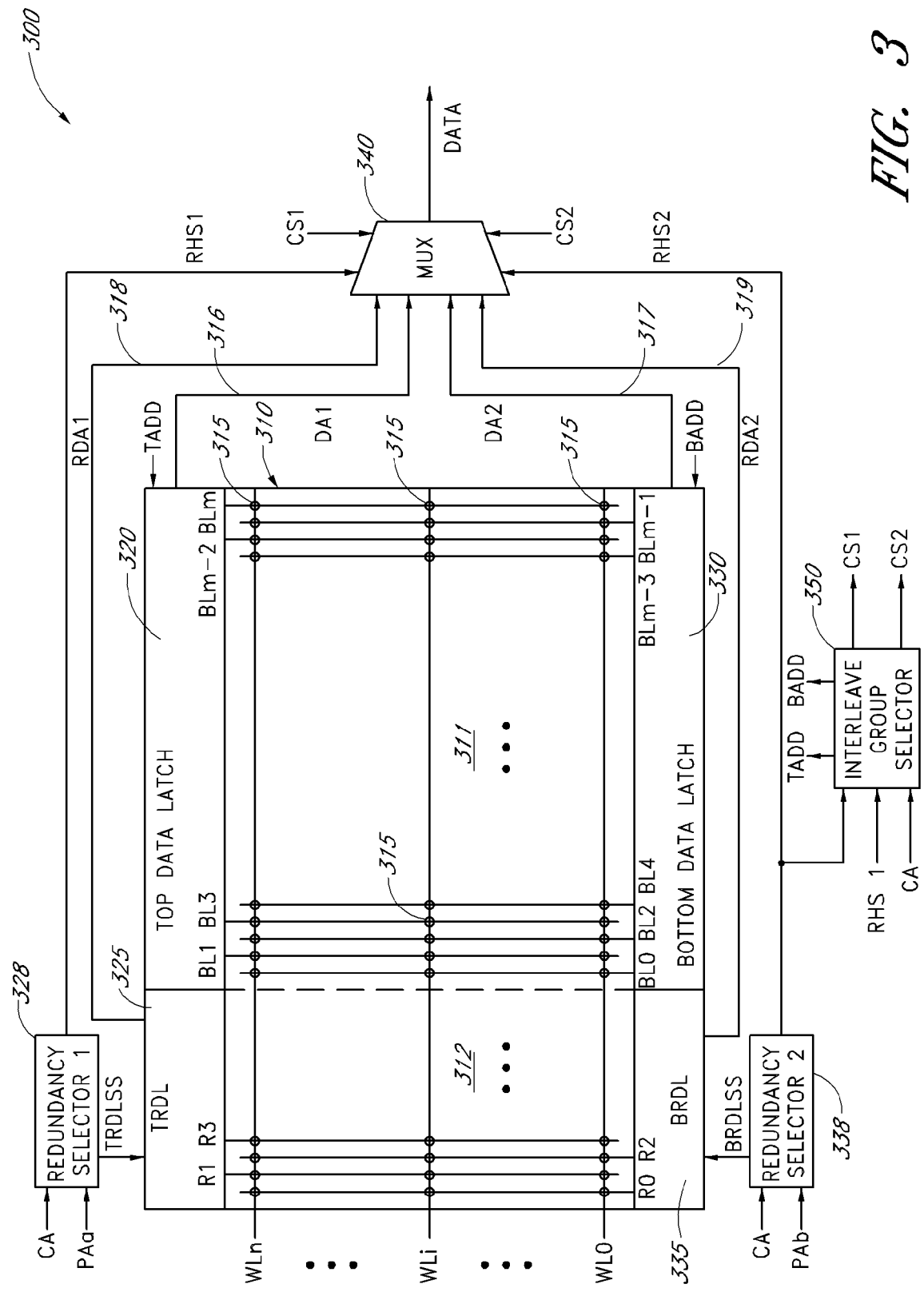
FIG. 3 is a schematic diagram of one embodiment of a NAND flash memory device employing an interleaved read scheme.

Referring to FIG. 3, one embodiment of a NAND flash memory device 300 employing an interleaved read scheme will now be described. The illustrated NAND flash memory device 300 includes a memory block 310, a top data latch 320, a bottom data latch 330, a top redundant data latch (TRDL) 325, a bottom redundant data latch (BRDL) 335, a multiplexer 340, a first redundancy selector 328, a second redundancy selector 338, and an interleave group selector 350. The NAND flash memory device 300 also includes a top data line 316, a bottom data line 317, a top redundant data line 318, and a bottom redundant data line 319. The NAND flash memory device 300 may include other memory blocks. In addition, the NAND flash memory device 300 may include other components, for example, sense amplifiers, address decoders, and a controller, for its operation.

The memory block 310 includes a plurality of word lines WL0-WLn, a plurality of bit lines BL0-BLm, and a plurality of memory cells 315. The plurality of word lines WL0-WLn extend substantially parallel to one another. The plurality of bit lines BL0-BLm extend substantially parallel to one another and substantially perpendicular to the word lines WL0-WLn. The memory cells 315 are coupled to corresponding word lines WL0-WLn and bit lines BL0-BLm. A bit line and memory cells on the bit line forms a column.

In the illustrated embodiment, the memory block 310 includes a regular section 311 and a repair section 312. The repair section 312 is positioned at the left side of the regular section 311 of the memory block 310, but it will be understood that the repair section can be positioned at the right side of the regular section 311 or any other suitable location in the memory block 310 in other embodiments.

In the regular section 311, even-numbered and odd-numbered columns alternately extend parallel to one another. The columns in the regular section 311 may be referred to as regular columns. In the illustrated embodiment, the odd-numbered columns are electrically coupled to the top data latch 320, and the even-numbered columns are electrically coupled to the bottom data latch 330. In other embodiments, the odd-numbered columns are electrically coupled to the bottom data latch 330, and the even-numbered columns are electrically coupled to the top data latch 320. In the context of this document, the odd-numbered columns can be collectively referred to as a first interleave group (IG1). The even-numbered columns can be collectively referred to as a second interleave group (IG2).

The repair section 312 includes a plurality of columns that can be used to replace columns in the regular section 311. The columns in the repair section 312 may be referred to as redundant columns, repair columns, replacement columns or the like. Similar to the columns in the regular section 311, odd-numbered columns R1, R3, . . . are electrically coupled to the top redundant data latch 325, and the even-numbered columns R0, R2, . . . are electrically coupled to the bottom redundant data latch 335. In other embodiments, odd-numbered columns R1, R3, . . . are electrically coupled to the bottom redundant data latch 335, and the even-numbered columns R0, R2, . . . are electrically coupled to the top redundant data latch 325.

In the context of this document, the odd-numbered columns in the repair section 312 can be collectively referred to as a first redundancy interleave group (RIG1). The even-numbered columns in the repair section 312 can be collectively referred to as a second redundancy interleave group (RIG2). In the context of this document, RIG1 may be referred to as the corresponding redundancy interleave group of IG1. RIG2 may be referred to as the corresponding redundancy interleave group of IG2.

The top data latch 320 receives and stores data read from the odd-numbered columns in the regular section 311. The top data latch 320 outputs the data to the multiplexer 340. The bottom data latch 330 receives and stores data read from the even-numbered columns in the regular section 311. The top data latch 330 outputs the data to the multiplexer 340. Each of the top data latch 320 and the bottom data latch 330 may include a group of latch elements.

The top redundant data latch 325 receives and stores data read from the odd-numbered columns in the repair section 312. The top redundant data latch 325 outputs the data to the multiplexer 340. The bottom redundant data latch 335 receives and stores data read from the even-numbered columns in the repair section 312. The bottom redundant data latch 335 outputs the data to the multiplexer 340. Each of the top redundant data latch 320 and the bottom redundant data latch 330 may include a group of latch elements.

The multiplexer 340 receives data output from the top data latch 320, the bottom data latch 330, the top redundant data latch 325, and the bottom redundant data latch 335. The multiplexer 340 is configured to selectively output one of outputs from the data latches 320, 330, 325, 335 for each period of a read clock signal in response to control signals which will be described in greater detail later.

The interleave group selector 350 is configured to receive a column address signal CA, and to generate top and bottom address signal TADD, BADD in response to the column address signal CA. The top and bottom address signals TADD, BADD are provided to the top and bottom data latches 320, 330, respectively. The interleave group selector 350 is also configured to control the multiplexer 340 in response to the column address signal CA. The interleave group selector 350 provides first and second control signals CS1, CS2 to the multiplexer 340. In response to the first control signal CS1, the multiplexer 340 outputs data from the top data latch 320. In response to the second control signal CS2, the multiplexer 340 outputs data from the bottom data latch 330.

The first redundancy selector 328 receives the column address signal CA and a first programmable address signal PAa, and generates a top redundancy select signal TRDLSS in response to the signals CA, PAa. The first redundancy selector 328 also generates a first redundancy hit signal RHS1 in response to the signals CA, PAa, and provides it to the multiplexer 340. In response to the first redundancy hit signal RHS1, the multiplexer 340 outputs data from the top redundancy data latch 325. The first redundancy selector 328 also sends the first redundancy hit signal RHS1 to the interleave group selector 350 to disable at least one of the first and second control signal CS1, CS2.

The second redundancy selector 338 receives the column address signal CA and a second programmable address signal PAb, and generates a bottom redundancy select signal BRDLSS in response to the signals CA, PAb. The second redundancy selector 338 also generates a second redundancy hit signal RHS2 in response to the signals CA, PAb, and provides it to the multiplexer 340. In response to the second redundancy hit signal RHS2, the multiplexer 340 outputs data from the bottom redundancy data latch 335. The second redundancy selector 338 also sends the second redundancy hit signal RHS2 to the interleave group selector 350 to disable at least one of the first and second control signal CS1, CS2.

Figure 4A:
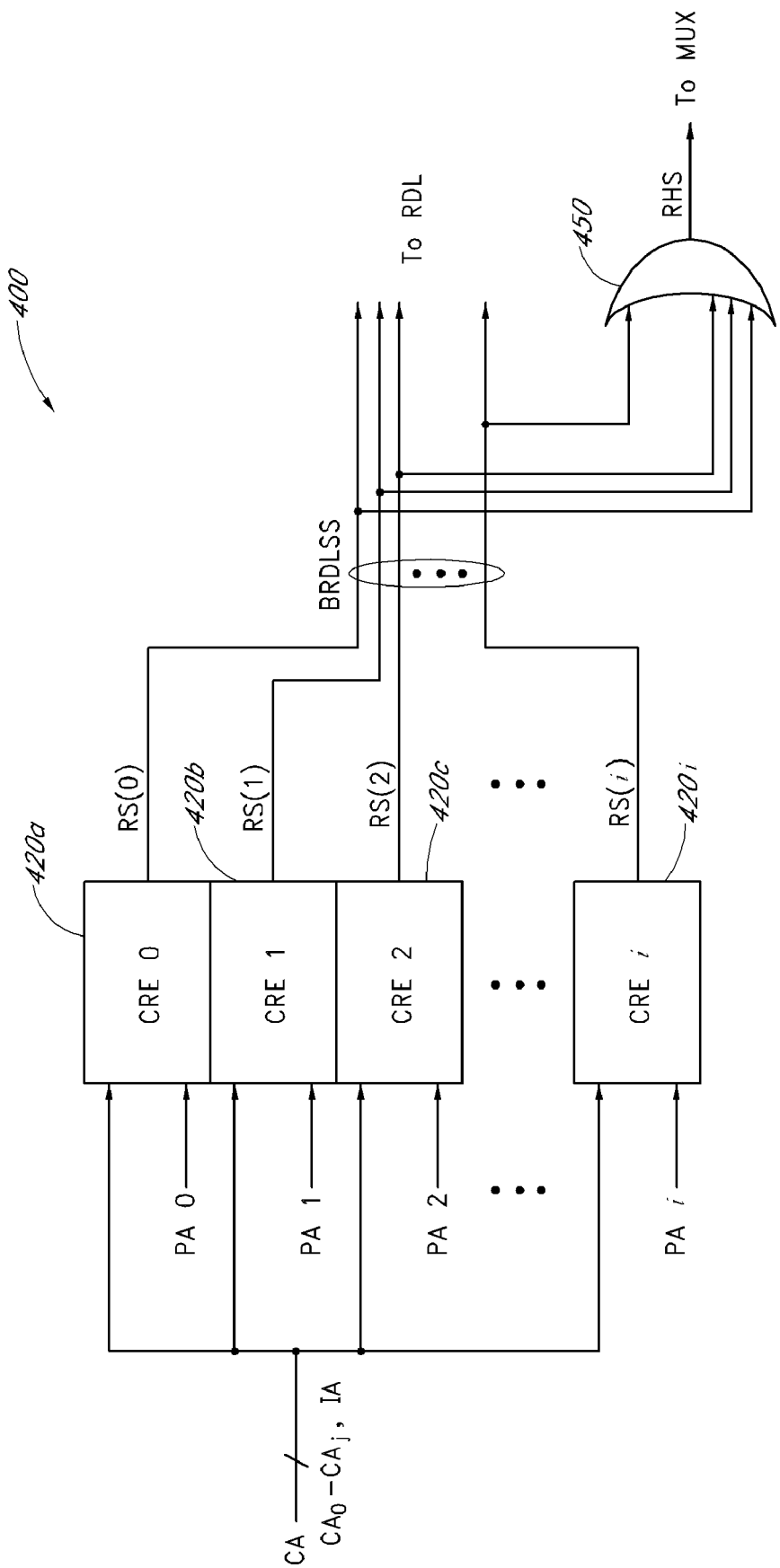
FIG. 4A is a schematic diagram of one embodiment of the redundancy selector of FIG. 3.

Referring to FIG. 4A, a redundancy selector according to one embodiment will be described below. Each of the first and second redundancy selectors 328, 338 of FIG. 3 can have the same configuration as the redundancy selector of FIG. 4A. The illustrated redundancy selector 400 includes a plurality of column redundancy elements 420a-420i and an OR gate 450. In one embodiment, a number of the column redundancy elements 420a-420i is equal to a number of redundant columns in a respective redundancy interleave group RIG1 or RIG2.

The column redundancy elements 420a-420i are configured to map the column address of a defective column in the regular section 311 (FIG. 3) to a redundancy column in the repair section 312 (FIG. 3). Each of the column redundancy elements 420a-420i receives a column address signal CA. In the illustrated embodiment where the NAND flash memory device 300 includes two interleave groups, the column address signal CA includes a plurality of column address bits $CA_0$-$CA_j$, and an interleave address bit IA. The interleave address bit IA indicates which interleave group is assigned to a given column address CA. The interleave address bit IA may be selected from bits in the column address signal CA provided by an external device (not shown). Such selection of the interleave address bit IA may be transparent to the external device.

In other embodiments where the NAND flash memory includes four or more interleave groups, the number of interleave address bits may be increased as the number of interleave groups is increased. For example, in an embodiment where the NAND flash memory includes four interleave groups, an interleave address may include two bits selected from bits in a column address signal CA.

Each of the column redundancy elements 420a-420i also receives a respective one of programmed address signals PA0-PAi. Each of the programmed address signal PA0-PAi indicates a respective one of defective columns in the regular section 311. Each of the programmed address signals PA0-PAi includes a plurality of bits that represent the address of a defective column.

Such addresses of defective columns may be determined during the manufacturing process, and may be stored in the NAND flash memory device 300 in, for example, fuses or any suitable type of ROM. In other embodiments, the storage can include one or more of other memory blocks in the NAND flash memory device 300. In addition, each of the defective columns is assigned a respective one of the redundant columns to replace the defective column.

In assigning redundant columns to replace defective columns, a defective column in the first interleave group (IG1) may be assigned a redundant column in the first redundancy interleave group (RIG1), and a defective column in the second interleave group (IG2) may be assigned a redundant column in the second redundancy interleave group (RIG2). In other embodiments, a defective column in the IG2 may be assigned a redundant column in the RIG1, and a defective column in the IG1 may be assigned a redundant column in the RIG2.

In certain embodiments, when a number of defective columns in the IG1 exceeds a number of redundant columns in the RIG1, at least one of the defective columns in the IG1 can be assigned one of the redundant columns in the RIG2. Similarly, when a number of defective columns in the IG2 exceeds a number of redundant columns in the RIG2, at least one of the defective columns in the IG2 can be assigned one of the redundant columns in the RIG1. Thus, in contrast to the conventional multi-way NAND flash memory device described above in connection with FIG. 2A, even if the number of defective columns in one interleave group exceeds a number of redundant columns in the corresponding redundancy interleave group, the NAND flash memory can still be repaired, thereby increasing yield.

The column redundancy elements 420a-420i are configured to output redundancy select signals RS(0)-RS(i), depending on whether the signals CA, PA0-PAi that they have received match each other. When any of the column redundancy elements 420a-420i receives a column address signal CA that matches a programmed address signal PA0-PAi that the column redundancy element is receiving, the column redundancy element outputs a "high" redundancy select signal. Because the other column redundancy elements 420a-420i are receiving different programmed address signals, they output "low" redundancy select signals. These redundancy select signals RS(0)-RS(i) are provided collectively as the top or bottom redundancy select signal TRDLSS or BRDLSS to the top or bottom redundant data latch 325 or 335. These redundancy select signals RS(0)-RS(i) are used to select the corresponding redundant column in the repair section 312 for data read.

The OR gate 450 is configured to generate a redundancy hit signal RHS when any of the redundant columns is selected for data read. The OR gate 450 receives the redundancy select signals RS(0)-RS(i) from the column redundancy elements 420a-420i, and conducts an OR operation on the redundancy select signals RS(0)-RS(i). When any one of the redundancy select signals RS(0)-RS(i) is "high," the OR gate 450 generates a "high" redundancy hit signal RHS and provides it to the multiplexer 340 (FIG. 3). In addition, the "high" redundancy hit signal RHS is provided to the interleave group selector 350, and disables at least one of the first and second control signals CS1, CS2.

Figure 4B:
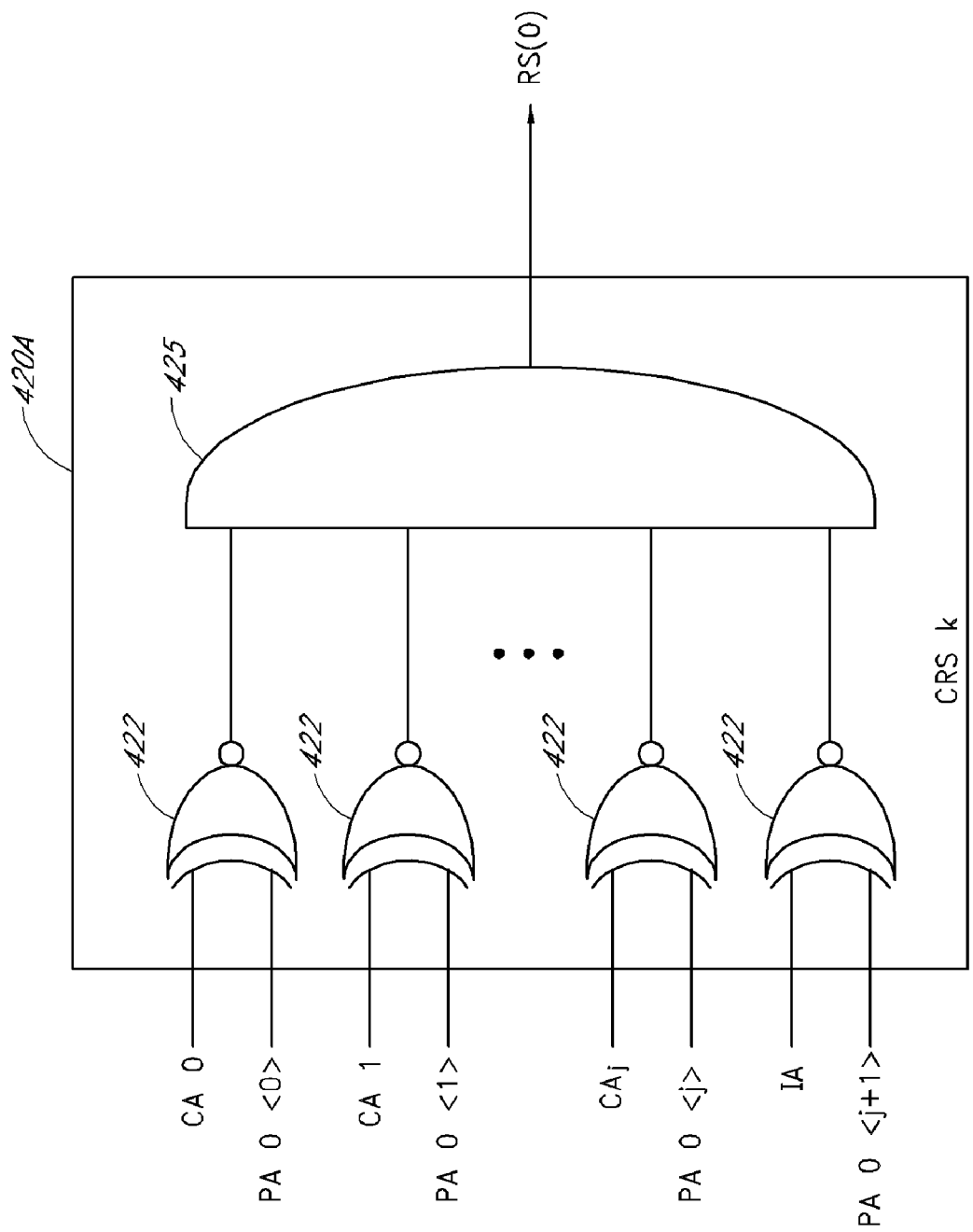
FIG. 4B is a schematic diagram of one embodiment of the column redundancy element of the redundancy selector of FIG. 4A.

Referring to FIG. 4B, a column redundancy element according to one embodiment will be described below in detail. The illustrated column redundancy element 420a may be a first column redundancy element 420a of FIG. 4A for selecting a first redundant column R0 in FIG. 3. The other column redundancy elements 420b-420i can also have the same configuration as the first column redundancy element 420a. The illustrated column redundancy element includes a plurality of XNOR gates 422 and an AND gate 425.

Each of the XNOR gates 422 receives a respective one of column address bits $CA_0$-CA, or an interleave address bit IA. Each of the XNOR gates 422 also receives a respective one of bits PA0<1> to PA0<j+1> of a programmed address signal PA0. Each of the XNOR gates 422 conducts an XNOR operation on these signals, and outputs a "high" output signal when the signals match each other, and otherwise a "low" output signal.

The AND gate 425 receives output signals from the XNOR gates 422 and conducts an AND operation on the output signals. Only when all the output signals are "high," the AND gate 425 outputs a "high" redundancy select signal RS(0). Otherwise, the AND gate 425 outputs a "low" redundancy select signal RS(0).

In other embodiments, column redundancy elements may include electrical fuses or latch circuits for providing the same function as the column redundancy elements of FIG. 4B. A skilled artisan will appreciate that various other schemes may be adapted for selecting redundant columns in accordance with the principles of the embodiment described above.

Figure 5:
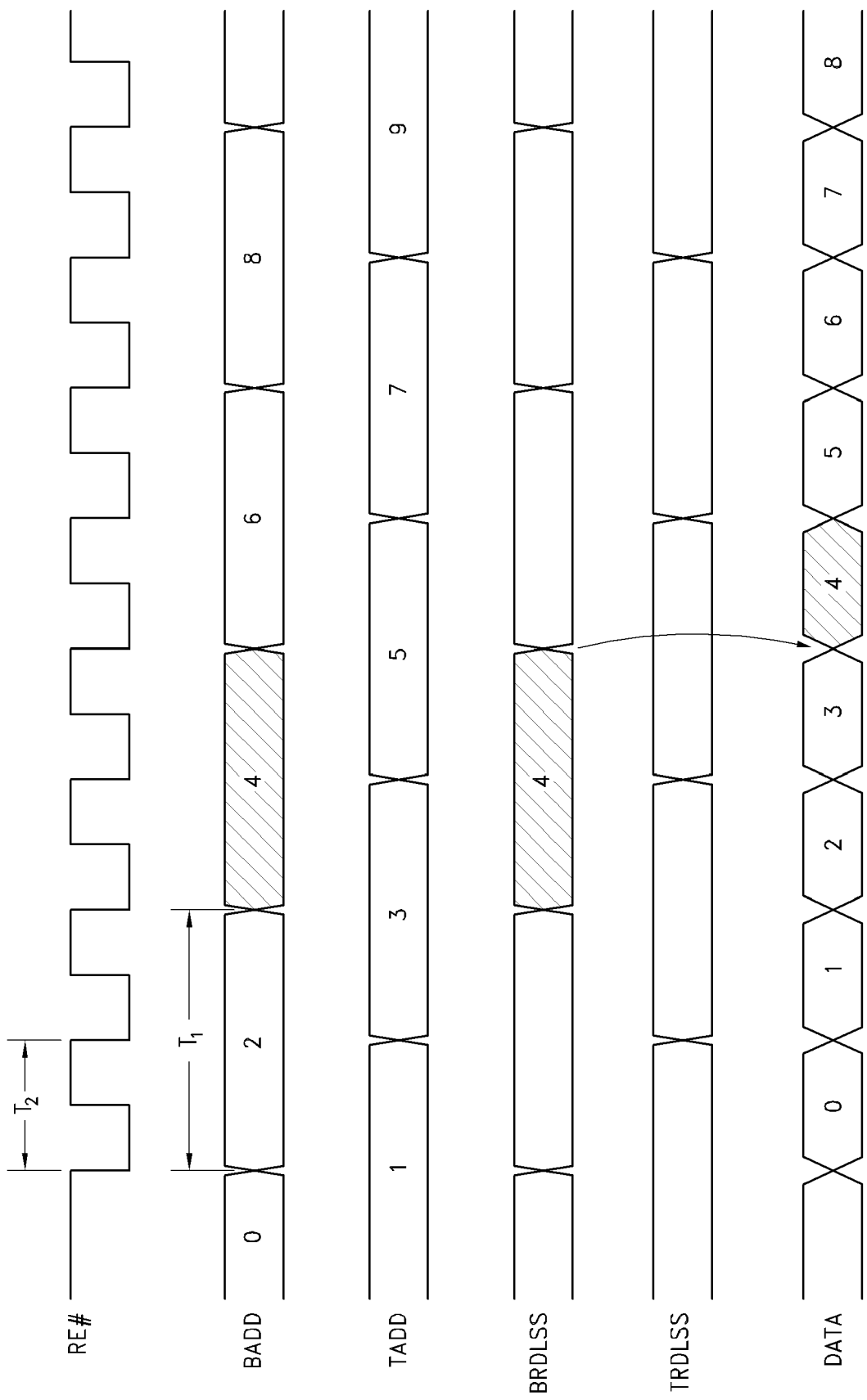
FIG. 5 is a timing diagram illustrating a two-way interleaved read scheme for the NAND flash memory device of FIG. 3 according to one embodiment.

Referring to FIGS. 3 and 5, a 2-way interleaved read operation of the NAND flash memory device of FIG. 3 will be described below. When a number of defective columns in each interleave group does not exceed a number of redundant columns in the corresponding redundancy interleave group, the NAND flash memory device 300 can be configured to perform the 2-way interleaved read operation.

Figure 2B:
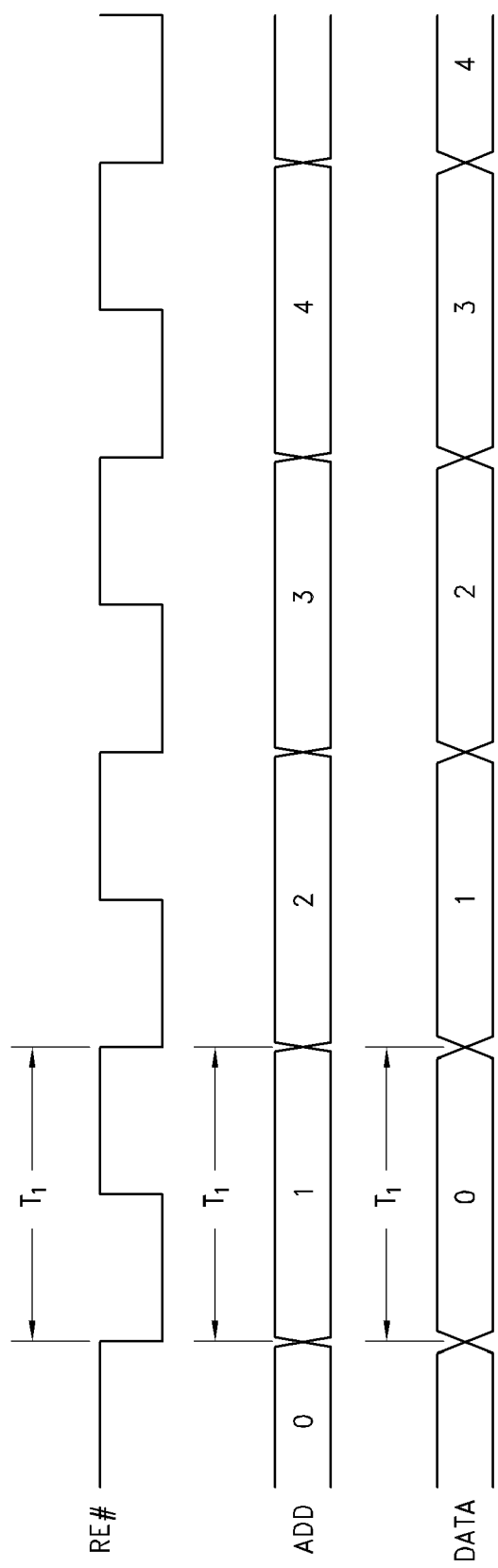
FIG. 2B is a timing diagram illustrating a conventional one-way interleaved read scheme for the NAND flash memory device of FIG. 2A.
Figure 2C:
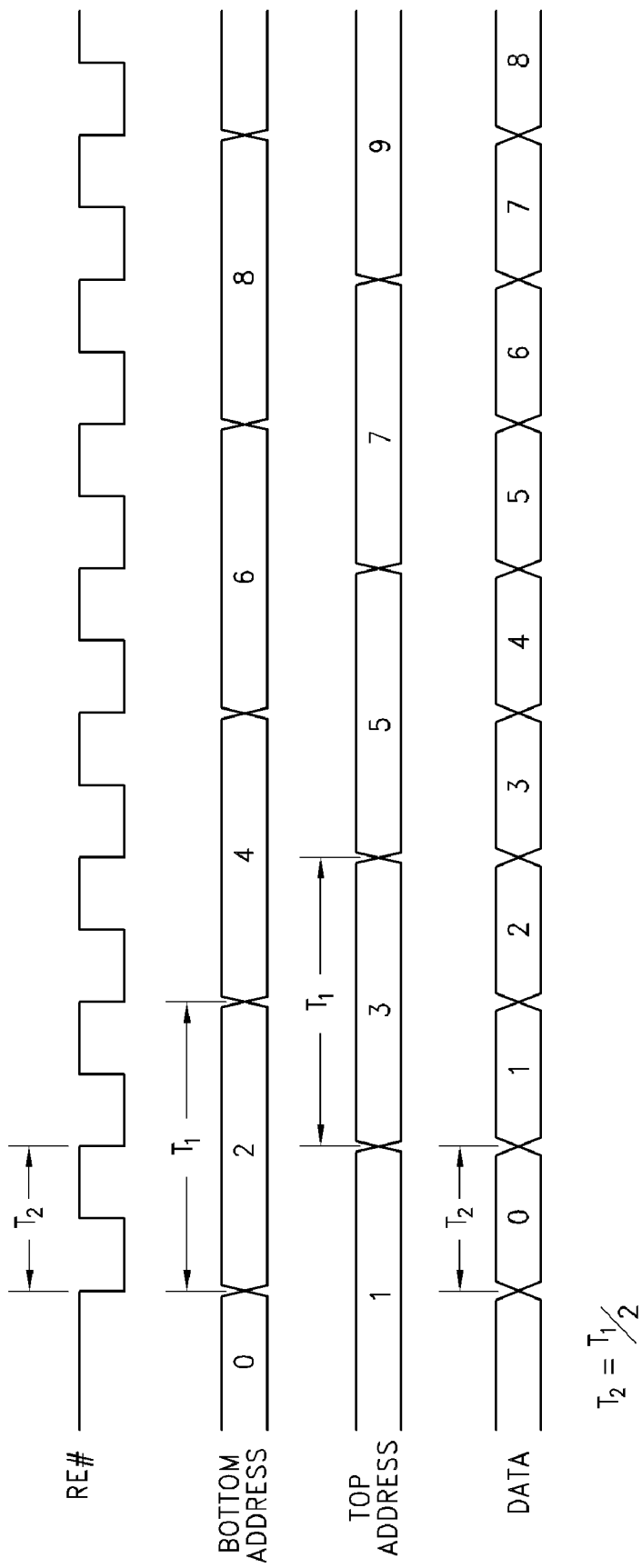
FIG. 2C is a timing diagram illustrating a conventional two-way interleaved read scheme for the NAND flash memory device of FIG. 2A.

During a read operation of the NAND flash memory device 300, a read clock signal RE# and a column address CA are provided to the NAND flash memory device 300. In the illustrated example, the read clock signal RE# has a period of $T_2$ and a frequency of f2. In one embodiment, the period $T_2$ of the read clock signal RE# of FIG. 5 may be half of the period $T_1$ of FIG. 2B, and the frequency f2 may be twice as high as the frequency f1 of FIG. 2B. In some embodiments, $T_2$ can be from about 25 nanoseconds to about 30 nanoseconds.

A bottom address signal BADD and a top address signal TADD may be generated and provided by the interleave group selector 350 to the memory block 310. Each of the top and bottom bit line address signals TADD, BADD has a period $T_1$ that is twice as long as the period $T_2$ of the read clock signal RE#. Thus, each of the top and bottom bit line address signals TADD, BADD has a frequency f1 that is half of the frequency f2 of the read clock signal RE#. The top and bottom bit line address signals TADD, BADD have a phase difference of 180° or a time difference of $T_2$ with each other. The top bit line address signal TADD sequentially provides odd-numbered bit line addresses where memory cells to be read are located. Similarly, the bottom bit line address signal BADD sequentially provides even-numbered bit line addresses where memory cells to be read are located.

During a read operation, a word line is selected. For example, in FIG. 3, an i-th word line WLi is selected. The bit lines address signals TADD, BADD are provided to the memory block 310. Data digits stored in memory cells on the selected word line are sensed and transferred to the top data latch 320 and the bottom data latch 330.

The top and bottom bit line address signals TADD, BADD are provided to the top and bottom data latches 320, 330, respectively. An odd-numbered bit line address in the top bit line address signal TADD may be maintained for two periods of the read clock signal RE#. In other words, the top bit line address signal TADD transitions at every other falling edge of the read clock signal RE# in the illustrated embodiment. During this duration, the top data latch 220 transfers a stored data digit to a top data line 316. For example, when the bit line address indicates a second bit line BL1, a data digit stored on a data latch coupled to the second bit line BL1 is transferred to the top data line 316. During a subsequent period of the read clock signal RE#, the data digit stored in the top data line 316 is output through the multiplexer 340.

Meanwhile, an even-numbered bit line address in the bottom bit line address signal BADD may be maintained for two periods of the read clock signal RE#. The bottom bit line address signal BADD transitions at different every other falling edge of the read clock signal RE# in FIG. 5. Thus, transitions of the bottom bit line address signal BADD and the top bit line address signal TADD alternate with each other. Upon receiving the bottom bit line address signal BADD, the bottom data latch 330 transfers a stored data digit to a bottom data line 317. For example, when a bit line address signal indicates a third bit line BL2, a data digit stored on a data latch coupled to the third bit line BL2 is transferred to the bottom data line 317. During a subsequent period of the read clock signal RE#, the data digit stored in the bottom data line 317 is output through the multiplexer 340. In this manner, data digits stored on memory cells on odd-numbered and even-numbered bit lines are alternately output through the multiplexer 340.

Meanwhile, the bottom redundant data latch 335 and the top redundant data latch 325 receive the redundancy select signals BRDLSS, TRLDSS from the redundancy selectors 338, 328. The bottom redundancy select signal BRDLSS can have the same period and frequency as the bottom address signal BADD, and transition at the same falling edges of the read clock signal RE# as the bottom address signal BADD. The top redundancy select signal TRDLSS can have the same period and frequency as the top address signal TADD, and transition at the same falling edges of the read clock signal RE# as the top address signal TADD.

When one or more of columns in an interleave group is defective, one or more of the defective columns can be replaced with one or more redundant columns in the corresponding redundancy interleave group. For example, when a column in the first interleave group IG1 is defective, the column can be replaced with a redundant column in the first redundancy interleave group RIG1. The column address of the defective column is stored in the NAND flash memory device 300 and is provided as a programmed address to one of the redundancy selectors 328, 338 to select a redundant column. When the redundancy selector receives the column address of the defective column, it selects the redundant column for data read, and generates a redundant hit signal RHS for the corresponding redundant data latch. This redundant hit signal also disables at least one of the control signals CS1, CS2. In this manner, the multiplexer 340 outputs data from the redundant column, instead of the defective column.

In certain instances, a number of defective columns in one interleave group may exceed a number of available redundant columns in the corresponding redundant interleave group while a total number of defective columns is less than a total number of redundant columns. In such instances, the NAND flash memory device 300 can be repaired as described above. The repaired NAND flash memory device 300 can carry out a one-way interleaved read operation described below.

Figure 6:
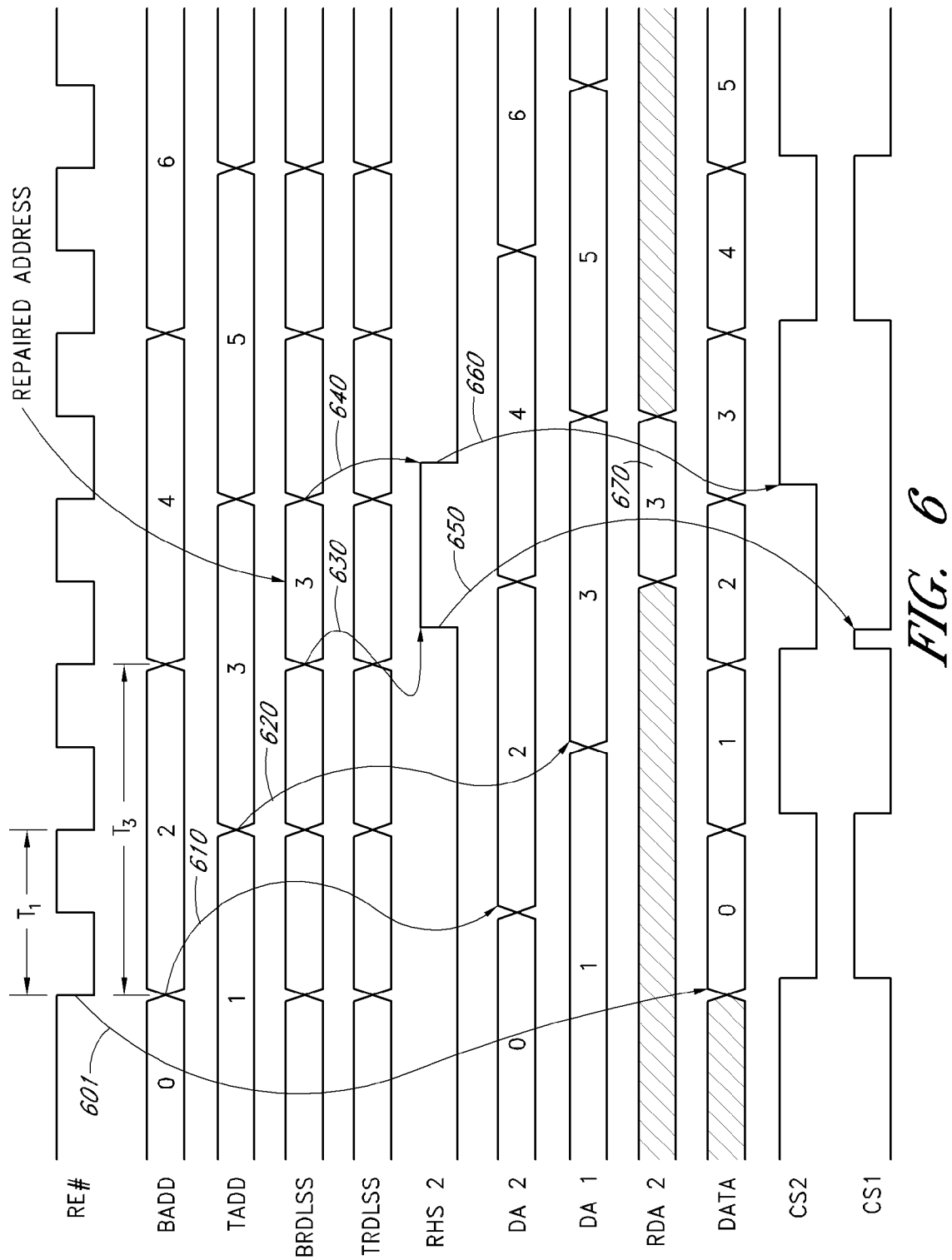
FIG. 6 is a timing diagram illustrating a one-way interleaved read scheme for the NAND flash memory device of FIG. 3 according to another embodiment.

Referring to FIGS. 3 and 6, one embodiment of such a one-way interleaved read scheme that can be used with the repaired NAND flash memory device 300 will be described below. A read clock signal RE# having a period of $T_1$ is provided to the NAND flash memory 300. $T_1$ may be twice as long as $T_2$ of FIG. 5.

A bottom address signal BADD having a period of $T_3$ is generated by the interleave group selector 350, and is supplied to the bottom data latch 330. $T_3$ may be twice as long as $T_1$. The bottom address signal BADD transitions at every other falling edge of the read clock signal RE#. According to the bottom address signal BADD, the bottom data latch 335 receives and stores data DA2 from the selected column at the immediately following rising edge of the read clock signal RE# for a duration of period $T_3$ (arrow 610). The bottom data latch 335 also provides the data DA2 to the multiplexer 340.

A top address signal TADD having a period of $T_3$ is generated by the interleave group selector 350, and is supplied to the top data latch 320. The top address signal TADD transitions at every other falling edge of the read clock signal RE#. The top address signal TADD transitions at falling edges of the read clock signal RE# that is different from the falling edges at which the bottom address signal BADD transitions, as shown in FIG. 6. According to the top address signal TADD, the top data latch 325 receives and stores data DA1 from the selected column at the immediately following rising edge of the read clock signal RE# for a duration of a period $T_3$ (arrow 620). The top data latch 335 also provides the data DA1 to the multiplexer 340.

A bottom redundancy select signal BRDLSS having a period of $T_1$ is generated by the second redundancy selector 338 and is supplied to the bottom redundant data latch 335. A top redundant data latch select signal TRDLSS having a period of $T_1$ is generated by the first redundancy selector 328 and is supplied to the top redundant data latch 325.

When the selected columns are not defective, the first and second control signals CS1, CS2 are generated by the interleave group selector 350. The first and second control signals CS1, CS2 have a period of $T_3$ and a frequency of f3. The first and second control signals CS1, CS2 have opposite phase from each other. When a column address indicates a column in the first interleave group IG1, the first control signal CS1 is at a "high" level, and data from the column in the IG1 is output as data DATA through the multiplexer 340. Likewise, when a column address indicates a column in the second interleave group IG2, the second control signal CS2 is at a "high" level, and data from the column in the IG2 is output through the multiplexer 340. In this manner, data bits from the columns in the IG1 and IG2 can be alternately output through the multiplexer 340 for each period of the read clock signal RE# (arrow 601).

In the illustrated example, a column BL3 in the first interleave group IG1 is defective and is programmed to be replaced with a redundant column R0 in the second redundancy interleave group RIG2. Thus, the address of the column BL3 is provided as a programmed address PA0<0> to PA0<j+1> (FIG. 4A) to a first column redundancy element 420a of the second redundancy selector 338. When the second redundancy selector 338 receives the column address of the defective column BL3, it selects the redundant column R0, and data from the redundant column R0 is provided to the multiplexer 340. In addition, the second redundancy selector 338 generates a "high" second redundancy hit signal RHS2 (arrow 630). This second redundancy hit signal RHS2 disables the first control signal CS1 which would otherwise be at a "high" level (arrow 650). Thus, the multiplexer 340 can output the data 670 read from the redundant column R0.

The second redundancy hit signal RHS2 transitions back to "low" (arrow 640) after the second redundancy selector 338 receives a next column address that is different from the address of the column BL3. Thus, one of the first and second control signals CS1, CS2 are enabled again (arrow 660) for outputting data from columns in the regular section 311. In this manner, a one-way interleave read scheme is possible with the NAND flash memory device 300 of FIG. 3.

Figure 7:
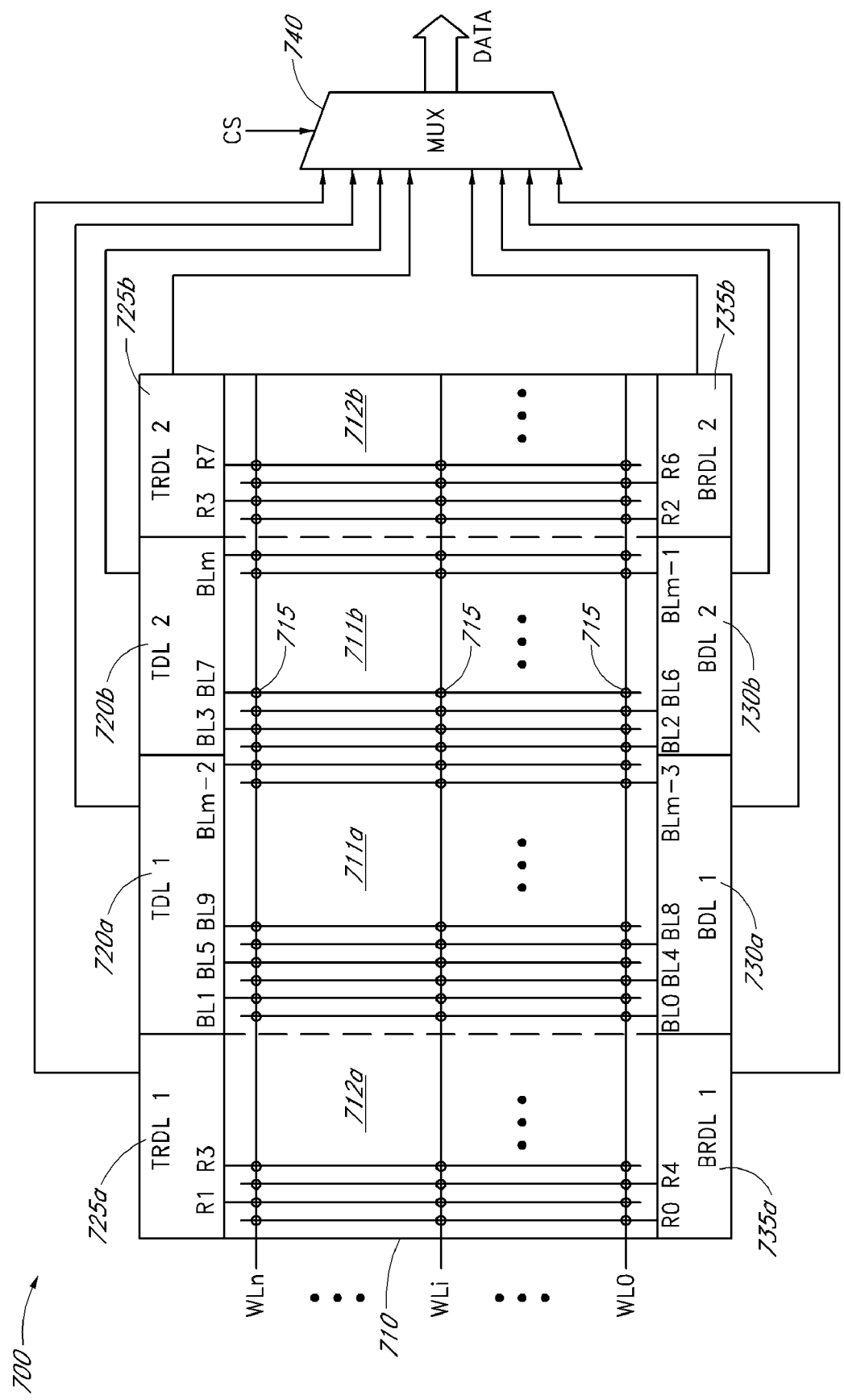
FIG. 7 is a schematic diagram of another embodiment of a NAND flash memory device employing an interleaved read scheme.

Referring to FIG. 7, another embodiment of a NAND flash memory device employing an interleaved read scheme will be described. The illustrated NAND flash memory device 700 includes a memory block 710, a first top data latch 720a, a second top data latch 720b, a first bottom data latch 730a, a second bottom data latch 730b, a first top redundant data latch (TRDL1) 725a, a second top redundant data latch (TRDL2) 725b, a first bottom redundant data latch (BRDL1) 735a, a second bottom redundant data latch (BRDL2) 735b, and a multiplexer 740. Although not illustrated, the NAND flash memory device 700 can further include an interleave group selector similar to that of FIG. 3. The NAND flash memory device 700 can also include redundancy selectors for each of the redundant data latches 725a, 725b, 735a, 735b, similar to those of FIG. 3. In addition, the NAND flash memory device 700 may include other memory blocks and other components, for example, sense amplifiers, address decoders, and a controller, for the operation thereof.

The memory block 710 includes a plurality of word lines WL0-WLn, a plurality of bit lines BL0-BLm, and a plurality of memory cells 715. The plurality of word lines WL0-WLn extend substantially parallel to one another. The plurality of bit lines BL0-BLm extend substantially parallel to one another and substantially perpendicular to the word lines WL0-WLn. The memory cells 715 are coupled to corresponding word lines WL0-WLn and bit lines BL0-BLm.

In the illustrated embodiment, the memory block 710 includes a first regular section 711a, a second regular section 711b, a first repair section 712a, and a second repair section 712b. In the illustrated embodiment, the first repair section 712a is positioned at the left side of the first regular section 711a, and the second repair section 712b is positioned at the right side of the second regular section 711b. In other embodiments, the first and second repair sections 712a, 712b may be adjacent to each other, either in the center of the memory block or on one side of the regular sections 711a, 711b depending on the design of the memory block 710.

In the regular sections 711a, 711b, even-numbered and odd-numbered columns alternately extend parallel to one another. The odd-numbered columns are electrically coupled to the top data latches 720a, 720b, and even-numbered columns are electrically coupled to the bottom data latches 730a, 730b, or vice versa. In the context of this document, the odd-numbered columns BL1, BL5, BL9, . . . that are coupled to the first top data latch 720a can be collectively referred to as a first interleave group (IG1). The odd-numbered columns BL3, BL7, BL11, . . . that are coupled to the second top data latch 720b can be collectively referred to as a second interleave group (IG2). The even-numbered columns BL0, BL4, BL8, . . . that are coupled to the first bottom data latch 730a can be collectively referred to as a third interleave group (IG3). The even-numbered columns BL2, BL6, BL10, . . . that are coupled to the second bottom data latch 730b can be collectively referred to as a fourth interleave group (IG2).

Each of the repair sections 712a, 712b includes a plurality of columns that can be used to replace columns in the regular sections 711a, 711b. Similar to the columns BL0-BLm in the regular section 711a, 711b, odd-numbered columns R1, R3, . . . in the repair sections 712a, 712b are electrically coupled to either the first or second top redundant data latch 725a, 715b. Even-numbered columns R0, R2, . . . in the repair sections 712a, 712b are electrically coupled to either the first or second bottom redundant data latch 735a, 735.

In the context of this document, the odd-numbered columns in the first repair section 712a that are coupled to the first top redundant data latch 725a can be collectively referred to as a first redundancy interleave group (RIG1). The odd-numbered columns in the second repair section 712b that are coupled to the second top redundant data latch 725b can be collectively referred to as a second redundancy interleave group (RIG2). The even-numbered columns in the first repair section 712a that are coupled to the first bottom redundant data latch 735a can be collectively referred to as a third redundancy interleave group (RIG3). The even-numbered columns in the second repair section 712b that are coupled to the second bottom redundant data latch 735b can be collectively referred to as a fourth redundancy interleave group (RIG4).

In the context of this document, RIG1 may be referred to as the corresponding redundancy interleave group of IG1. RIG2 may be referred to as the corresponding redundancy interleave group of IG2. RIG3 may be referred to as the corresponding redundancy interleave group of IG3. RIG4 may be referred to as the corresponding redundancy interleave group of IG4.

Each of the top data latches 720a, 720b receives and stores data read from the odd-numbered columns in a respective one of the regular sections 711a, 711b. Each of the top data latches 720a, 720b outputs the data to the multiplexer 740. Each of the bottom data latches 730a, 730b receives and stores data read from the even-numbered columns in a respective one of the regular sections 711a, 711b. The bottom data latches 730a, 730b output the data to the multiplexer 740.

Each of the first and second top redundant data latches 725a, 725b receives and stores data read from the odd-numbered columns in a respective one of the first and second repair sections 712a, 712b. The top redundant data latches 725a, 725b output the data to the multiplexer 740. Each of the first and second bottom redundant data latches 735a, 735b receives and stores data read from the even-numbered columns in a respective one of the first and second repair sections 712a, 712b. The bottom redundant data latches 735a, 735b output the data to the multiplexer 740.

The multiplexer 740 receives data output from the top data latches 720a, 720b, the bottom data latch 730a, 730b, the top redundant data latches 725a, 725b, and the bottom redundant data latches 735a, 735b. The multiplexer 740 is configured to selectively output one of the outputs from the latches 720a, 720b, 730a, 730b, 725a, 725b, 735a, 735b for each period of a read clock signal in response to control signals CS provided by the interleave group selector and the redundancy selectors.

In one instance, a number of defective columns in each of the interleave groups IG1-IG4 does not exceed a number of redundancy columns in the corresponding redundancy interleave group RIG1-RIG4. Defective columns in the interleave groups IG1-IG4 can be replaced with redundant columns in the corresponding redundancy interleave groups RIG1-RIG4. In such an instance, the NAND flash memory 700 can conduct a four-way interleave read operation where data bits from the four interleave groups IG1-IG4 are sequentially output through the multiplexer 740 for each period of a read clock signal having a first period.

In other instances, a number of defective columns in any one of the interleave groups IG1-IG4 may exceed a number of redundancy columns in the corresponding redundancy interleave group RIG1-RIG4. In such an instance, at least one defective column in the interleave group may be replaced with a redundant column in another redundancy interleave group that is not the corresponding redundancy interleave group. For example, a defective column in IG1 can be replaced with a redundancy column in RIG2, RIG3, or RIG4.

In some instances, while the number of defective columns in a particular interleave groups IG1-IG4 may exceed the number of redundancy columns in the corresponding redundancy interleave group, the total number of defective odd-numbered columns in the regular section 711a, 711b should not exceed a total number of odd-numbered redundancy columns in RIG1 and RIG2. In addition, the total number of defective even-numbered columns in the regular section 711a, 711b should not exceed a total number of even-numbered redundancy columns in RIG1 and RIG2. In such instances, a defective column in IG1 can be replaced with a redundancy column in RIG2, or a defective column in IG2 can be replaced with a redundancy column in RIG1. In addition, a defective column in IG3 can be replaced with a redundancy column in RIG4, or a defective column in IG4 can be replaced with a redundancy column in RIG3. In these instances, the NAND flash memory 700 can conduct a two-way interleaved read operation where data bits from the odd-numbered columns and even-numbered columns are sequentially output through the multiplexer 740 for each period of a read clock signal having a second period that is twice as long as the first period used for the four-way interleaved scheme.

In other instances, a total number of defective odd-numbered columns in the regular section 711a, 711b may exceed a total number of odd-numbered redundancy columns in RIG1 and RIG2. Alternatively, a total number of defective even-numbered columns in the regular section 711a, 711b may exceed a total number of even-numbered redundancy columns in RIG1 and RIG2. In such instances, a defective odd-numbered column in IG1 or IG2 can be replaced with a redundancy column in RIG3 or RIG4, or a defective even-numbered column in IG3 or IG4 can be replaced with a redundancy column in RIG1 or RIG2. In such instances, the NAND flash memory 700 can conduct a one-way interleaved read operation where data bits from the odd-numbered columns and even-numbered columns are sequentially output through the multiplexer 740 for each period of a read clock signal having a third period that is twice as long as than the second period used for the two-way interleaved scheme.

In the embodiments described above, defective columns in each interleave group may be determined by a test equipment during the manufacturing process of the NAND flash memory device. A skilled artisan will appreciate that various types of test equipments can be used for determining whether columns are defective.

In the embodiments described above, the NAND flash memory devices 300 of FIG. 3 can be set to use either one-way or two-way interleave read scheme, depending on whether a number of defective columns in an interleave group exceeds a number of redundancy columns in the corresponding redundancy interleave group. Similarly, the NAND flash memory devices 700 of FIG. 7 can be set to use one of one-way, two-way, or four-way interleave read scheme. Thus, the embodiments can increase the production yield of NAND flash memory devices.

In other embodiments, the manufactures may choose a desired interleave scheme, depending on needs, for example, market demand. Thus, the embodiments described above provide flexibility in NAND flash memory manufacturing.

A flash memory device according to the embodiments described above can be incorporated in various electronic devices. Examples of the electronic devices can include, but are not limited to, consumer electronic products, electronic circuits, electronic circuit components, parts of the consumer electronic products, electronic test equipments, etc. Examples of the consumer electronic products include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, an optical camera, a digital camera, a washer, a dryer, a washer/dryer, a copier, a facsimile machine, a scanner, a multi functional peripheral device, a wrist watch, a clock, etc. Further, the electronic device can include unfinished products.

One embodiment is an apparatus including a memory block having a plurality of columns. Each of the columns includes a bit line and a plurality of memory cells. The plurality of columns includes a plurality of groups of regular columns and a plurality of groups of redundant columns. The apparatus further includes a plurality of groups of data latches. Each of the groups of data latches is configured to store data read from a respective one group of regular columns. The apparatus also includes a plurality of groups of redundant data latches. Each of the groups of redundant data latches is configured to store data read from a respective one group of redundant columns. The apparatus also includes a multiplexer configured to selectively output data from the plurality of groups of data latches and the plurality of groups of redundant data latches. The apparatus is configured to assign a redundant column in one of the groups of redundant columns to replace a defective regular column in any one of the groups of regular columns.

Another embodiment is a method of reading data from a flash memory device including a memory block, wherein the memory block includes a plurality of rows and a plurality of columns. Each of the columns includes a bit line and a plurality of memory cells. The plurality of columns includes a plurality of groups of regular columns and a plurality of groups of redundant columns. Each of the rows includes a word line and a plurality of the memory cells coupled to the word line. The method includes: selecting a row of the memory block; sequentially latching a first set of data digits from a first group of regular columns in the memory block; sequentially latching a second set of data digits from a second group of regular columns in the memory block; and latching a data digit from a redundant column in one of the groups of redundant columns in the memory block. The redundant column is configured to replace a defective column in either the first or second group of regular columns. The method further includes sequentially outputting the latched data digits, wherein sequentially outputting the latched data digits includes multiplexing the first and second sets of data digits and the data digit from the redundant column.

Yet another embodiment is a method of manufacturing a flash memory device. The method includes: testing a flash memory device including: a memory block including a plurality of columns, each of the columns including a bit line and a plurality of memory cells on the bit line, the plurality of columns including a plurality of groups of regular columns and a plurality of groups of redundant columns; a plurality of groups of data latches, each of the data latches being configured to store data read from a respective group of regular columns; a plurality of groups of redundant data latches, each of the redundant data latches being configured to store data read from a respective group of redundant columns; and a multiplexer configured to selectively output data from the plurality of groups of data latches and the plurality of groups of redundant data latches. The method also includes identifying a defective column in each of the groups of regular columns; and assigning a redundant column in any one of the plurality of groups of redundant columns to replace the defective column.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

We claim:
1. An apparatus comprising:
   a memory block having a plurality of columns, each of the columns comprising a bit line and a plurality of memory cells, the plurality of columns including first and second interleave groups of regular columns and third and fourth redundancy interleave groups of redundant columns;

first and second data latches configured to store data read from the first and second interleave groups of regular columns, respectively;

third and fourth redundant data latches configured to store data read from the third and fourth redundancy interleave groups of redundant columns, respectively;

a multiplexer comprising at least four inputs, each of which is electrically coupled to a respective one of the first and second data latches and the third and fourth redundant data latches; and a control circuit for the multiplexer, wherein the control circuit is configured provide control signals to the multiplexer such that the multiplexer outputs data in an alternating manner from at least one of the first or second data latches and at least one of the third or fourth redundant data latches to perform an interleaved read scheme.

2. The apparatus of claim 1, wherein the apparatus is configured to map a column address of at least one regular column in the first interleave group to a redundant column in the third or fourth redundancy interleave group.

3. The apparatus of claim 1, wherein the plurality of columns further comprise fifth and sixth interleave groups of regular columns and seventh and eighth redundancy interleave groups of redundant columns.

4. The apparatus of claim 3, wherein the apparatus is configured to map a column address of at least one regular column in the first interleave group to a redundant column in the seventh or eighth redundancy interleave group.

5. The apparatus of claim 1, further comprising a redundancy selector configured to select a redundant column at least partly in response to the column address of a regular column.

6. The apparatus of claim 5, wherein the redundancy selector comprises:

a plurality of column redundancy elements, each of the column redundancy elements being configured to receive a column address of a regular column and a programmed address, the programmed address indicating a defective regular column, and to output a redundancy signal indicative of whether the column address and the programmed address match each other; and a first logic gate configured to perform an OR operation on the redundancy signals from the plurality of column redundancy elements, and to output a redundancy hit signal.

7. The apparatus of claim 6, further comprising an interleave group selector configured to provide the multiplexer with one or more control signals to allow the multiplexer to alternately output data from the data latches.

8. The apparatus of claim 6, wherein each of the column redundancy elements comprises a plurality of second logic gates and a third logic gate, each of the second logic gates being configured to perform an XNOR operation on a respective one bit of the column address and a respective one bit of the programmed address, and to provide an output to the third logic gate, the third logic gate being configured to perform an AND operation on the outputs from the second logic gates, and to output one of the redundancy signals.

9. The apparatus of claim 1, wherein the apparatus is configured to switch among two or more of one-way, two-way, and four-way interleaved read schemes.

10. The apparatus of claim 1, wherein the apparatus is configured to perform an interleaved read scheme having a same number of ways as a number of the interleave groups when a number of defective columns in each of the interleave groups is equal to or less than a number of redundant columns in a respective one of the redundancy interleave groups.

11. The apparatus of claim 1, wherein the apparatus is configured to perform an interleaved read scheme having a lower number of ways than a number of the interleave groups when a number of defective columns in any of the interleave groups exceeds a number of redundant columns in a respective one of the redundancy interleave groups.

12. An electronic device, comprising:

a memory block comprising a regular section and a repair section, wherein the regular section further comprises even-numbered columns and odd-numbered columns alternating with each other, wherein the repair section further comprises even-numbered redundant columns and odd-numbered redundant columns alternating with each other;

a first data latch electrically coupled to the even-numbered columns, but not to the odd-numbered columns, in the regular section;

a second data latch electrically coupled to the odd-numbered columns, but not to the even-numbered columns, in the regular section;

a first redundant data latch electrically coupled to the even-numbered redundant columns, but not to the odd-numbered redundant columns, in the repair section;

a second redundant data latch electrically coupled to the odd-numbered redundant columns, but not to the odd-numbered columns, in the repair section;

a multiplexer comprising first to fourth inputs electrically coupled to the first data latch, the second data latch, the first redundant data latch, and the second redundant data latch, respectively; and a control circuit for the multiplexer, wherein the control circuit is configured provide control signals to the multiplexer such that the multiplexer outputs data in an alternating manner from at least one of the first or second data latches and at least one of the third or fourth redundant data latches to perform an interleaved read scheme.

13. The device of claim 12, wherein the first data latch is positioned on an opposite side of the memory block from the second data latch, and wherein the first redundant data latch is positioned on an opposite side of the memory block from the second redundant data latch.

14. The device of claim 12, wherein the memory block further comprises a plurality of word lines, each of which crosses the even-numbered and odd-numbered columns and the even-numbered and odd-numbered redundant columns.

15. The device of claim 12, further comprising:

a first redundancy selector configured to provide control signals to one or more of the first redundancy latch and the multiplexer at least partly in response to a column address;

a second redundancy selector configured to provide control signals to one or more of the second redundancy latch and the multiplexer at least partly in response to the column address; and an interleave group selector configured to provide control signals to one or more of the first data latch, the second data latch, and the multiplexer at least partly in response to one or more of the column address and the control signals from the first and second redundancy selectors.

16. The device of claim 12, wherein the device is configured to switch among two or more of one-way, two-way, and four-way interleaved read schemes.

17. A method of reading data from a flash memory device comprising a memory block, wherein the memory block includes a plurality of rows and a plurality of columns, each of the columns comprising a bit line and a plurality of memory cells, the plurality of columns including first and second interleave groups of regular columns and first and second redundancy interleave groups of redundant columns, each of the rows comprising a word line coupled to a respective row of the memory cells, the method comprising:
- latching a first set of data digits that are sequentially read from the first interleave group of regular columns in the memory block;
- latching a second set of data digits that are sequentially read from the second interleave group of regular columns in the memory block;
- latching a data digit from a redundant column in the first redundancy interleave group of redundant columns in the memory block, the redundant column being configured to replace a defective column in the first interleave group of regular columns;
- outputting the latched first and second sets of data digits via first and second lines, respectively, to a multiplexer;
- outputting the latched data digit from the redundant column via a third line to the multiplexer; and
- outputting the first and second sets of data digits in an alternating manner from the multiplexer while outputting the data digit from the redundant column from the multiplexer between two immediately subsequent data digits in the second set.

18. The method of claim 17, further comprising:
- latching a data digit from an other redundant column in the second redundancy interleave group of redundant columns in the memory block, the other redundant column being configured to replace an other defective column in the first interleave group of regular columns;
- outputting the latched data digit from the other redundant column via a fourth line to the multiplexer; and
- outputting the data digit from the other redundant column from the multiplexer between two immediately subsequent data digits in the second set.

19. The method of claim 17, wherein the method comprises performing one interleaved read scheme selected from a plurality of interleaved read schemes, based on whether a number of defective columns in each of the interleave groups exceeds a number of redundant columns in a respective one of the redundancy interleave groups.

20. The method of claim 17, wherein the method comprises performing an interleaved read scheme having a lower number of ways than a number of the interleave groups when a number of defective columns in any of the interleave groups exceeds a number of redundant columns in a respective one of the redundancy interleave groups.

* * * * *

UNITED STATES PATENT AND TRADEMARK OFFICE
CERTIFICATE OF CORRECTION

PATENT NO.        : 8,081,511 B2
APPLICATION NO.   : 12/898070
DATED             : December 20, 2011
INVENTOR(S)       : Jin-Man Han et al.

It is certified that error appears in the above-identified patent and that said Letters Patent is hereby corrected as shown below:

In column 17, line 12, in Claim 1, delete "configured" and insert -- configured to --, therefor.

In column 18, lines 25-26, in Claim 12, delete "odd-numbered" and insert -- even-numbered --, therefor.

In column 18, line 32, in Claim 12, delete "configured" and insert -- configured to --, therefor.

Signed and Sealed this
Twenty-seventh Day of March, 2012

David J. Kappos
*Director of the United States Patent and Trademark Office*